United States Patent
Danek et al.

(10) Patent No.: US 10,529,722 B2
(45) Date of Patent: Jan. 7, 2020

(54) TUNGSTEN FOR WORDLINE APPLICATIONS

(71) Applicant: Lam Research Corporation, Fremont, CA (US)

(72) Inventors: Michal Danek, Cupertino, CA (US); Hanna Bamnolker, Cupertino, CA (US); Raashina Humayun, Los Altos, CA (US); Juwen Gao, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 15/925,579

(22) Filed: Mar. 19, 2018

(65) Prior Publication Data

US 2018/0219014 A1 Aug. 2, 2018

Related U.S. Application Data

(63) Continuation of application No. 15/040,561, filed on Feb. 10, 2016, now Pat. No. 9,953,984.
(Continued)

(51) Int. Cl.
*H01L 21/00* (2006.01)
*H01L 27/108* (2006.01)
(Continued)

(52) U.S. Cl.
CPC .... *H01L 27/10891* (2013.01); *C23C 16/0272* (2013.01); *C23C 16/08* (2013.01);
(Continued)

(58) Field of Classification Search
CPC ......... H01L 21/28088; H01L 21/28562; H01L 21/76843; H01L 21/76876; H01L 21/76877; H01L 27/11582
See application file for complete search history.

(56) References Cited

U.S. PATENT DOCUMENTS

| 4,746,375 A | 5/1988 | Iacovangelo |
| 4,804,560 A | 2/1989 | Shioya et al. |

(Continued)

FOREIGN PATENT DOCUMENTS

| CN | 1115723 C | 7/2003 |
| CN | 101154576 A | 4/2008 |

(Continued)

OTHER PUBLICATIONS

U.S. Office Action, dated Apr. 7, 2014, issued in U.S. Appl. No. 13/633,502.
(Continued)

*Primary Examiner* — Richard A Booth
(74) *Attorney, Agent, or Firm* — Weaver Austin Villeneuve & Sampson LLP

(57) ABSTRACT

Disclosed herein are methods and related apparatus for formation of multi-component tungsten-containing films including multi-component tungsten-containing films diffusion barriers. According to various embodiments, the methods involve deposition of multi-component tungsten-containing films using tungsten chloride ($WCl_x$) precursors and boron (B)-containing, silicon (Si)-containing or germanium (Ge)-containing reducing agents.

19 Claims, 6 Drawing Sheets

Related U.S. Application Data

(60) Provisional application No. 62/115,012, filed on Feb. 11, 2015.

(51) Int. Cl.

| | |
|---|---|
| *H01L 21/768* | (2006.01) |
| *H01L 21/28* | (2006.01) |
| *H01L 27/11582* | (2017.01) |
| *H01L 21/285* | (2006.01) |
| *C23C 16/02* | (2006.01) |
| *C23C 16/08* | (2006.01) |
| *C23C 16/30* | (2006.01) |
| *H01L 27/11556* | (2017.01) |
| *H01L 23/532* | (2006.01) |

(52) U.S. Cl.
 CPC ........ *C23C 16/30* (2013.01); *H01L 21/28088* (2013.01); *H01L 21/28562* (2013.01); *H01L 21/76843* (2013.01); *H01L 21/76876* (2013.01); *H01L 21/76877* (2013.01); *H01L 27/11582* (2013.01); *H01L 23/53257* (2013.01); *H01L 23/53266* (2013.01); *H01L 27/10823* (2013.01); *H01L 27/11556* (2013.01); *H01L 29/40117* (2019.08)

(56) References Cited

U.S. PATENT DOCUMENTS

| | | | |
|---|---|---|---|
| 4,874,719 A | 10/1989 | Kurosawa | |
| 4,962,063 A | 10/1990 | Maydan et al. | |
| 5,028,565 A | 7/1991 | Chang et al. | |
| 5,227,329 A | 7/1993 | Kobayashi et al. | |
| 5,250,329 A | 10/1993 | Miracky et al. | |
| 5,250,467 A | 10/1993 | Somekh et al. | |
| 5,308,655 A | 5/1994 | Eichman et al. | |
| 5,326,723 A | 7/1994 | Petro et al. | |
| 5,370,739 A | 12/1994 | Foster et al. | |
| 5,391,394 A | 2/1995 | Hansen | |
| 5,567,583 A | 10/1996 | Wang et al. | |
| 5,633,200 A | 5/1997 | Hu | |
| 5,661,080 A | 8/1997 | Hwang et al. | |
| 5,726,096 A | 3/1998 | Jung | |
| 5,795,824 A | 8/1998 | Hancock | |
| 5,804,249 A | 9/1998 | Sukharev et al. | |
| 5,817,576 A | 10/1998 | Tseng et al. | |
| 5,833,817 A | 11/1998 | Tsai et al. | |
| 5,913,145 A | 6/1999 | Lu et al. | |
| 5,916,365 A | 6/1999 | Sherman | |
| 5,916,634 A | 6/1999 | Fleming et al. | |
| 5,926,720 A | 7/1999 | Zhao et al. | |
| 5,950,108 A * | 9/1999 | Wu .................. | H01L 21/76843 257/E21.584 |
| 5,956,609 A | 9/1999 | Lee et al. | |
| 5,963,833 A | 10/1999 | Thakur | |
| 5,994,749 A | 11/1999 | Oda | |
| 6,001,729 A | 12/1999 | Shinriki et al. | |
| 6,017,818 A | 1/2000 | Lu | |
| 6,034,419 A | 3/2000 | Nicholls et al. | |
| 6,037,263 A | 3/2000 | Chang | |
| 6,066,366 A | 5/2000 | Berenbaum et al. | |
| 6,099,904 A | 8/2000 | Mak et al. | |
| 6,107,200 A | 8/2000 | Takagi et al. | |
| 6,143,082 A | 11/2000 | McInerney et al. | |
| 6,162,715 A | 12/2000 | Mak et al. | |
| 6,174,812 B1 | 1/2001 | Hsiung et al. | |
| 6,206,967 B1 | 3/2001 | Mak et al. | |
| 6,245,654 B1 | 6/2001 | Shih et al. | |
| 6,260,266 B1 | 7/2001 | Tamaki | |
| 6,265,312 B1 | 7/2001 | Sidhwa et al. | |
| 6,277,744 B1 | 8/2001 | Yuan et al. | |
| 6,284,316 B1 | 9/2001 | Sandhu et al. | |
| 6,287,964 B1 | 9/2001 | Cho | |
| 6,287,965 B1 | 9/2001 | Kang et al. | |
| 6,294,468 B1 | 9/2001 | Gould-Choquette et al. | |
| 6,297,152 B1 | 10/2001 | Itoh et al. | |
| 6,306,211 B1 | 10/2001 | Takahashi et al. | |
| 6,309,964 B1 | 10/2001 | Tsai et al. | |
| 6,309,966 B1 | 10/2001 | Govindarajan et al. | |
| 6,310,300 B1 | 10/2001 | Cooney et al. | |
| 6,340,629 B1 | 1/2002 | Yeo et al. | |
| 6,355,558 B1 | 3/2002 | Dixit et al. | |
| 6,404,054 B1 | 6/2002 | Oh et al. | |
| 6,429,126 B1 | 8/2002 | Herner et al. | |
| 6,465,347 B2 | 10/2002 | Ishizuka et al. | |
| 6,491,978 B1 | 12/2002 | Kalyanam | |
| 6,551,929 B1 | 4/2003 | Kori et al. | |
| 6,566,250 B1 | 5/2003 | Tu et al. | |
| 6,566,262 B1 | 5/2003 | Rissman et al. | |
| 6,581,258 B2 | 6/2003 | Yoneda et al. | |
| 6,593,233 B1 | 7/2003 | Miyazaki et al. | |
| 6,607,976 B2 | 8/2003 | Chen et al. | |
| 6,635,965 B1 | 10/2003 | Lee et al. | |
| 6,706,625 B1 | 3/2004 | Sudijono et al. | |
| 6,720,261 B1 | 4/2004 | Anderson et al. | |
| 6,740,585 B2 | 5/2004 | Yoon et al. | |
| 6,777,331 B2 | 8/2004 | Nguyen | |
| 6,797,340 B2 | 9/2004 | Fang et al. | |
| 6,844,258 B1 | 1/2005 | Fair et al. | |
| 6,861,356 B2 | 3/2005 | Matsuse et al. | |
| 6,902,763 B1 | 6/2005 | Elers et al. | |
| 6,903,016 B2 | 6/2005 | Cohen | |
| 6,905,543 B1 | 6/2005 | Fair et al. | |
| 6,908,848 B2 | 6/2005 | Koo | |
| 6,936,538 B2 | 8/2005 | Byun | |
| 6,939,804 B2 | 9/2005 | Lai et al. | |
| 6,962,873 B1 | 11/2005 | Park | |
| 7,005,372 B2 | 2/2006 | Levy et al. | |
| 7,141,494 B2 | 11/2006 | Lee et al. | |
| 7,157,798 B1 | 1/2007 | Fair et al. | |
| 7,211,144 B2 | 5/2007 | Lu et al. | |
| 7,220,671 B2 | 5/2007 | Simka et al. | |
| 7,235,486 B2 | 6/2007 | Kori et al. | |
| 7,262,125 B2 | 8/2007 | Wongsenakhum et al. | |
| 7,338,900 B2 | 3/2008 | Mizuno et al. | |
| 7,355,254 B2 | 4/2008 | Dana et al. | |
| 7,405,158 B2 | 7/2008 | Lai et al. | |
| 7,416,979 B2 | 8/2008 | Yoon et al. | |
| 7,419,904 B2 | 9/2008 | Kato | |
| 7,429,402 B2 | 9/2008 | Gandikota et al. | |
| 7,465,665 B2 | 12/2008 | Xi et al. | |
| 7,465,666 B2 | 12/2008 | Kori et al. | |
| 7,501,343 B2 | 3/2009 | Byun et al. | |
| 7,501,344 B2 | 3/2009 | Byun et al. | |
| 7,563,718 B2 | 7/2009 | Kim | |
| 7,589,017 B2 | 9/2009 | Chan et al. | |
| 7,595,263 B2 | 9/2009 | Chung et al. | |
| 7,605,083 B2 | 10/2009 | Lai et al. | |
| 7,611,990 B2 | 11/2009 | Yoon et al. | |
| 7,655,567 B1 | 2/2010 | Gao et al. | |
| 7,674,715 B2 | 3/2010 | Kori et al. | |
| 7,675,119 B2 | 3/2010 | Taguwa | |
| 7,691,749 B2 | 4/2010 | Levy et al. | |
| 7,695,563 B2 | 4/2010 | Lu et al. | |
| 7,709,385 B2 | 5/2010 | Xi et al. | |
| 7,732,327 B2 | 6/2010 | Lee et al. | |
| 7,745,329 B2 | 6/2010 | Wang et al. | |
| 7,745,333 B2 | 6/2010 | Lai et al. | |
| 7,749,815 B2 | 7/2010 | Byun | |
| 7,754,604 B2 | 7/2010 | Wongsenakhum et al. | |
| 7,772,114 B2 | 8/2010 | Chan et al. | |
| 7,955,972 B2 | 6/2011 | Chan et al. | |
| 7,964,505 B2 | 6/2011 | Khandelwal et al. | |
| 7,977,243 B2 | 7/2011 | Sakamoto et al. | |
| 8,048,805 B2 | 11/2011 | Chan et al. | |
| 8,053,365 B2 | 11/2011 | Humayun et al. | |
| 8,058,170 B2 | 11/2011 | Chandrashekar et al. | |
| 8,062,977 B1 | 11/2011 | Ashtiani et al. | |
| 8,071,478 B2 | 12/2011 | Wu et al. | |
| 8,087,966 B2 | 1/2012 | Hebbinghaus et al. | |
| 8,101,521 B1 | 1/2012 | Gao et al. | |
| 8,110,877 B2 | 2/2012 | Mukherjee et al. | |
| 8,119,527 B1 | 2/2012 | Chandrashekar et al. | |

(56) References Cited

U.S. PATENT DOCUMENTS

| | | |
|---|---|---|
| 8,207,062 B2 | 6/2012 | Gao et al. |
| 8,258,057 B2 | 9/2012 | Kuhn et al. |
| 8,329,576 B2 | 12/2012 | Chan et al. |
| 8,367,546 B2 | 2/2013 | Humayun et al. |
| 8,409,985 B2 | 4/2013 | Chan et al. |
| 8,409,987 B2 | 4/2013 | Chandrashekar et al. |
| 8,551,885 B2 | 10/2013 | Chen et al. |
| 8,623,733 B2 | 1/2014 | Chen et al. |
| 8,696,921 B2 | 4/2014 | Park et al. |
| 8,709,948 B2 | 4/2014 | Danek et al. |
| 8,853,080 B2 | 10/2014 | Guan et al. |
| 8,975,184 B2 | 3/2015 | Chen et al. |
| 8,993,055 B2 | 3/2015 | Rahtu et al. |
| 9,034,760 B2 | 5/2015 | Chen et al. |
| 9,076,843 B2 | 7/2015 | Lee et al. |
| 9,153,486 B2 | 10/2015 | Arghavani et al. |
| 9,159,571 B2 | 10/2015 | Humayun et al. |
| 9,230,815 B2 | 1/2016 | Fu et al. |
| 9,236,297 B2 | 1/2016 | Chen et al. |
| 9,240,347 B2 | 1/2016 | Chandrashekar et al. |
| 9,583,385 B2 | 2/2017 | Lee et al. |
| 9,589,808 B2 | 3/2017 | Bamnolker et al. |
| 9,595,470 B2 | 3/2017 | Bamnolker et al. |
| 9,613,818 B2 | 4/2017 | Ba et al. |
| 9,653,353 B2 | 5/2017 | Chandrashekar et al. |
| 9,673,146 B2 | 6/2017 | Chen et al. |
| 9,754,824 B2 | 9/2017 | Schloss et al. |
| 9,953,984 B2 | 4/2018 | Danek et al. |
| 9,969,622 B2 | 5/2018 | Lei et al. |
| 9,978,605 B2 | 5/2018 | Bamnolker et al. |
| 2001/0003061 A1 | 6/2001 | Chen et al. |
| 2001/0007797 A1 | 7/2001 | Jang et al. |
| 2001/0008808 A1 | 7/2001 | Gonzalez |
| 2001/0014533 A1 | 8/2001 | Sun |
| 2001/0015494 A1 | 8/2001 | Ahn |
| 2001/0044041 A1 | 11/2001 | Badding et al. |
| 2002/0037630 A1 | 3/2002 | Agarwal et al. |
| 2002/0090796 A1 | 7/2002 | Desai et al. |
| 2002/0117399 A1 | 8/2002 | Chen et al. |
| 2002/0155722 A1 | 10/2002 | Satta et al. |
| 2002/0168840 A1 | 11/2002 | Hong et al. |
| 2002/0177316 A1 | 11/2002 | Miller et al. |
| 2002/0190379 A1 | 12/2002 | Jian et al. |
| 2003/0013300 A1 | 1/2003 | Byun |
| 2003/0059980 A1 | 3/2003 | Chen et al. |
| 2003/0082902 A1 | 5/2003 | Fukui et al. |
| 2003/0091870 A1 | 5/2003 | Bhowmik et al. |
| 2003/0104126 A1 | 6/2003 | Fang et al. |
| 2003/0123216 A1 | 7/2003 | Yoon et al. |
| 2003/0127043 A1 | 7/2003 | Lu et al. |
| 2003/0129828 A1 | 7/2003 | Cohen et al. |
| 2003/0190424 A1 | 10/2003 | Sneh |
| 2003/0190802 A1 | 10/2003 | Wang et al. |
| 2003/0224217 A1 | 12/2003 | Byun et al. |
| 2004/0014315 A1 | 1/2004 | Lai et al. |
| 2004/0044127 A1 | 3/2004 | Okubo et al. |
| 2004/0142557 A1 | 7/2004 | Levy et al. |
| 2004/0151845 A1 | 8/2004 | Nguyen et al. |
| 2004/0202786 A1 | 10/2004 | Wongsenakhum et al. |
| 2004/0206267 A1 | 10/2004 | Sambasivan et al. |
| 2004/0247788 A1 | 12/2004 | Fang et al. |
| 2005/0009325 A1 | 1/2005 | Chung et al. |
| 2005/0031786 A1 | 2/2005 | Lee et al. |
| 2005/0059236 A1 | 3/2005 | Nishida et al. |
| 2005/0136594 A1 | 6/2005 | Kim |
| 2005/0191803 A1 | 9/2005 | Matsuse et al. |
| 2006/0003581 A1 | 1/2006 | Johnston et al. |
| 2006/0040052 A1 | 2/2006 | Fang et al. |
| 2006/0094238 A1 | 5/2006 | Levy et al. |
| 2006/0145190 A1 | 7/2006 | Salzman et al. |
| 2006/0211244 A1 | 9/2006 | Deshpande et al. |
| 2006/0284317 A1 | 12/2006 | Ito et al. |
| 2007/0087560 A1 | 4/2007 | Kwak et al. |
| 2007/0099420 A1 | 5/2007 | Dominguez et al. |
| 2007/0190780 A1 | 8/2007 | Chung et al. |
| 2007/0264105 A1 | 11/2007 | Pharand et al. |
| 2008/0017891 A1 | 1/2008 | Datta et al. |
| 2008/0045010 A1 | 2/2008 | Wongsenakhum et al. |
| 2008/0081127 A1 | 4/2008 | Thompson et al. |
| 2008/0081452 A1 | 4/2008 | Kim et al. |
| 2008/0081453 A1 | 4/2008 | Kim et al. |
| 2008/0124926 A1 | 5/2008 | Chan et al. |
| 2008/0254619 A1 | 10/2008 | Lin et al. |
| 2008/0254623 A1 | 10/2008 | Chan et al. |
| 2008/0280438 A1 | 11/2008 | Lai et al. |
| 2008/0283844 A1 | 11/2008 | Hoshi et al. |
| 2009/0045517 A1 | 2/2009 | Sugiura et al. |
| 2009/0050937 A1 | 2/2009 | Murata et al. |
| 2009/0053893 A1 | 2/2009 | Khandelwal et al. |
| 2009/0137117 A1 | 5/2009 | Park et al. |
| 2009/0142509 A1 | 6/2009 | Yamamoto |
| 2009/0149022 A1 | 6/2009 | Chan et al. |
| 2009/0160030 A1 | 6/2009 | Tuttle |
| 2009/0163025 A1 | 6/2009 | Humayun et al. |
| 2009/0315154 A1 | 12/2009 | Kirby et al. |
| 2010/0007797 A1 | 1/2010 | Stojancic |
| 2010/0035427 A1 | 2/2010 | Chan et al. |
| 2010/0055904 A1 | 3/2010 | Chen et al. |
| 2010/0062149 A1 | 3/2010 | Ma et al. |
| 2010/0072623 A1 | 3/2010 | Prindle et al. |
| 2010/0120245 A1 | 5/2010 | Tjandra et al. |
| 2010/0130002 A1 | 5/2010 | Dao et al. |
| 2010/0130003 A1 | 5/2010 | Lin et al. |
| 2010/0144140 A1 | 6/2010 | Chandrashekar et al. |
| 2010/0155846 A1 | 6/2010 | Mukherjee et al. |
| 2010/0159694 A1 | 6/2010 | Chandrashekar et al. |
| 2010/0240212 A1 | 9/2010 | Takahashi |
| 2010/0244141 A1 | 9/2010 | Beyer et al. |
| 2010/0244260 A1 | 9/2010 | Hinomura |
| 2010/0267230 A1 | 10/2010 | Chandrashekar et al. |
| 2010/0267235 A1 | 10/2010 | Chen et al. |
| 2010/0273327 A1 | 10/2010 | Chan et al. |
| 2010/0330800 A1 | 12/2010 | Ivanov et al. |
| 2011/0059608 A1 | 3/2011 | Gao et al. |
| 2011/0156154 A1 | 6/2011 | Hoentschel et al. |
| 2011/0159690 A1 | 6/2011 | Chandrashekar et al. |
| 2011/0221044 A1 | 9/2011 | Danek et al. |
| 2011/0223763 A1 | 9/2011 | Chan et al. |
| 2011/0233778 A1 | 9/2011 | Lee et al. |
| 2011/0236594 A1 | 9/2011 | Haverkamp et al. |
| 2011/0281438 A1 | 11/2011 | Lee et al. |
| 2012/0003833 A1 | 1/2012 | Khandelwal et al. |
| 2012/0009785 A1 | 1/2012 | Chandrashekar et al. |
| 2012/0015518 A1 | 1/2012 | Chandrashekar et al. |
| 2012/0040530 A1 | 2/2012 | Humayun et al. |
| 2012/0077342 A1 | 3/2012 | Gao et al. |
| 2012/0164832 A1 | 6/2012 | Chandrashekar et al. |
| 2012/0199887 A1 | 8/2012 | Chan et al. |
| 2012/0225192 A1 | 9/2012 | Yudovsky et al. |
| 2012/0231626 A1 | 9/2012 | Lee et al. |
| 2012/0244699 A1 | 9/2012 | Khandelwal et al. |
| 2012/0294874 A1 | 11/2012 | Macary et al. |
| 2013/0043554 A1 | 2/2013 | Piper |
| 2013/0062677 A1 | 3/2013 | Li et al. |
| 2013/0109172 A1 | 5/2013 | Collins et al. |
| 2013/0168864 A1 | 7/2013 | Lee et al. |
| 2013/0285195 A1 | 10/2013 | Piper |
| 2013/0302980 A1 | 11/2013 | Chandrashekar et al. |
| 2014/0011358 A1 | 1/2014 | Chen et al. |
| 2014/0027664 A1* | 1/2014 | Lei .................. C01B 35/146 252/62.3 R |
| 2014/0030889 A1 | 1/2014 | Chen et al. |
| 2014/0061784 A1 | 3/2014 | Kang |
| 2014/0061931 A1 | 3/2014 | Kang |
| 2014/0073135 A1 | 3/2014 | Guan et al. |
| 2014/0120723 A1 | 5/2014 | Fu et al. |
| 2014/0154883 A1 | 6/2014 | Humayun et al. |
| 2014/0162451 A1 | 6/2014 | Chen et al. |
| 2014/0308812 A1 | 10/2014 | Arghavani et al. |
| 2014/0319614 A1 | 10/2014 | Paul et al. |
| 2015/0037972 A1 | 2/2015 | Danek et al. |
| 2015/0050807 A1 | 2/2015 | Wu et al. |
| 2015/0056803 A1 | 2/2015 | Chandrashekar et al. |
| 2015/0179461 A1 | 6/2015 | Bamnolker et al. |

(56) References Cited

U.S. PATENT DOCUMENTS

| | | |
|---|---|---|
| 2015/0279732 A1 | 10/2015 | Lee et al. |
| 2015/0325475 A1 | 11/2015 | Bamnolker et al. |
| 2015/0348840 A1 | 12/2015 | Bamnolker et al. |
| 2016/0118345 A1 | 4/2016 | Chen et al. |
| 2016/0190008 A1 | 6/2016 | Chandrashekar et al. |
| 2016/0233220 A1 | 8/2016 | Danek et al. |
| 2016/0293467 A1 | 10/2016 | Caveney et al. |
| 2016/0336222 A1 | 11/2016 | Knapp et al. |
| 2016/0351401 A1 | 12/2016 | Ba et al. |
| 2016/0351444 A1 | 12/2016 | Schloss et al. |
| 2017/0053811 A1 | 2/2017 | Fung et al. |
| 2017/0117155 A1 | 4/2017 | Bamnolker et al. |
| 2017/0133231 A1 | 5/2017 | Bamnolker et al. |
| 2018/0240675 A1 | 8/2018 | Bamnolker et al. |

FOREIGN PATENT DOCUMENTS

| | | |
|---|---|---|
| CN | 101308794 A | 11/2008 |
| CN | 101952945 A | 1/2011 |
| CN | 103125013 A | 5/2013 |
| CN | 103579184 A | 2/2014 |
| CN | 104272440 A | 1/2015 |
| CN | 104272441 A | 1/2015 |
| EP | 0 437 110 | 7/1991 |
| EP | 1 156 132 | 11/2001 |
| EP | 1 179 838 | 2/2002 |
| JP | S5629648 A | 3/1981 |
| JP | S61-224313 A | 10/1986 |
| JP | H2-187031 A | 7/1990 |
| JP | H4-142061 A | 5/1992 |
| JP | H5-226280 A | 9/1993 |
| JP | H7-147321 A | 6/1995 |
| JP | H07-226393 | 8/1995 |
| JP | 08-115984 | 5/1996 |
| JP | 09-022896 A | 1/1997 |
| JP | 09-027596 | 1/1997 |
| JP | H10-144688 | 5/1998 |
| JP | H10-163132 | 6/1998 |
| JP | 2966406 B2 | 10/1999 |
| JP | 11-330006 | 11/1999 |
| JP | 2000-208516 | 7/2000 |
| JP | 2000-235962 | 8/2000 |
| JP | 2001-525889 | 12/2001 |
| JP | 2002-016066 A | 1/2002 |
| JP | 2002-124488 | 4/2002 |
| JP | 2003-193233 | 7/2003 |
| JP | 2004-235456 | 8/2004 |
| JP | 2004-273764 | 9/2004 |
| JP | 2005-029821 | 2/2005 |
| JP | 2005-518088 | 6/2005 |
| JP | 2007-009298 | 1/2007 |
| JP | 2007-027627 | 2/2007 |
| JP | 2007-027680 | 2/2007 |
| JP | 2007-507892 | 3/2007 |
| JP | 2007-520052 | 7/2007 |
| JP | 2007-250907 | 9/2007 |
| JP | 2007-251164 | 9/2007 |
| JP | 2008-016803 | 1/2008 |
| JP | 2008-060603 | 3/2008 |
| JP | 2008-091844 | 4/2008 |
| JP | 2008-283220 | 11/2008 |
| JP | 2009-024252 | 2/2009 |
| JP | 2009-024252 A | 2/2009 |
| JP | 2009-144242 | 7/2009 |
| JP | 2009-533877 | 9/2009 |
| JP | 2009-540123 | 11/2009 |
| JP | 2010-251760 A | 11/2010 |
| JP | 2011-035366 A | 2/2011 |
| JP | 2015-190020 A | 11/2015 |
| KR | 100272523 | 12/2000 |
| KR | 10-2002-0049730 | 6/2002 |
| KR | 10-2005-0022261 | 3/2005 |
| KR | 10-2005-0087428 | 8/2005 |
| KR | 10-2006-0087844 | 8/2006 |
| KR | 10-2007-705936 | 4/2007 |
| KR | 10-2008-0036679 | 4/2008 |
| KR | 10-2008-0110897 | 12/2008 |
| KR | 10-2009-0103815 | 10/2009 |
| TW | 310461 | 7/1997 |
| TW | 452607 | 9/2001 |
| WO | WO 98/51838 | 11/1998 |
| WO | WO 01/27347 | 4/2001 |
| WO | WO 01/29893 | 4/2001 |
| WO | WO 02/41379 | 5/2002 |
| WO | WO 03/029515 | 4/2003 |
| WO | WO 2005/027211 | 3/2005 |
| WO | WO 2005/034223 | 4/2005 |
| WO | WO 2007/121249 | 10/2007 |
| WO | WO 2007/146537 | 12/2007 |
| WO | WO 2010/025357 | 3/2010 |
| WO | WO 2011/119293 | 9/2011 |
| WO | WO 2013/148880 | 10/2013 |
| WO | WO 2014/052642 A1 | 4/2014 |
| WO | WO 2014/058536 | 4/2014 |

OTHER PUBLICATIONS

U.S. Final Office Action, dated Nov. 5, 2014, issued in U.S. Appl. No. 13/633,502.

U.S. Notice of Allowance, dated Mar. 2, 2015, issued in U.S. Appl. No. 13/633,502.

U.S. Notice of Allowance (Supplemental Notice of Allowability), dated Apr. 16, 2015, issued in U.S. Appl. No. 13/633,502.

U.S. Office Action, dated Jan. 12, 2016, issued in U.S. Appl. No. 14/738,685.

U.S. Final Office Action, dated Jul. 25, 2016, issued in U.S. Appl. No. 14/738,685.

U.S. Notice of Allowance, dated Oct. 13, 2016, issued in U.S. Appl. No. 14/738,685.

U.S. Office Action, dated May 30, 2014, issued in U.S. Appl. No. 13/862,048.

U.S. Final Office Action, dated Oct. 16, 2014, issued in U.S. Appl. No. 13/862,048.

U.S. Notice of Allowance, dated Apr. 28, 2015, issued in U.S. Appl. No. 13/862,048.

U.S. Notice of Allowance, dated Jun. 17, 2015, issued in U.S. Appl. No. 13/862,048.

U.S. Office Action, dated May 6, 2015, issued in U.S. Appl. No. 14/135,375.

U.S. Final Office Action, dated Sep. 29, 2015, issued in U.S. Appl. No. 14/135,375.

U.S. Office Action, dated Jan. 21, 2016, issued in U.S. Appl. No. 14/135,375.

U.S. Final Office Action, dated May 31, 2016, issued in U.S. Appl. No. 14/135,375.

U.S. Notice of Allowance, dated Oct. 25, 2016, issued in U.S. Appl. No. 14/135,375.

U.S. Office Action, dated Dec. 11, 2014, issued in U.S. Appl. No. 14/173,733.

U.S. Notice of Allowance, dated Jun. 2, 2015, issued in U.S. Appl. No. 14/173,733.

U.S. Office Action, dated Aug. 18, 2016, issued in U.S. Appl. No. 15/040,561.

U.S. Final Office Action, dated Dec. 30, 2016, issued in U.S. Appl. No. 15/040,561.

U.S. Office Action, dated Jul. 17, 2017, issued in U.S. Appl. No. 15/040,561.

U.S. Notice of Allowance, dated Dec. 19, 2017, issued in U.S. Appl. No. 15/040,561.

U.S. Office Action, dated Feb. 1, 2016, issued in U.S. Appl. No. 14/723,275.

U.S. Office Action, dated Jul. 28, 2016, issued in U.S. Appl. No. 14/723,275.

U.S. Final Office Action, dated Jan. 20, 2017, issued in U.S. Appl. No. 14/723,275.

U.S. Notice of Allowance, dated May 4, 2017, issued in U.S. Appl. No. 14/723,275.

U.S. Office Action, dated Jul. 12, 2016, issued in U.S. Appl. No. 14/723,270.

(56) References Cited

OTHER PUBLICATIONS

U.S. Notice of Allowance, dated Nov. 18, 2016, issued in U.S. Appl. No. 14/723,270.
U.S. Office Action, dated Jul. 20, 2017, issued in U.S. Appl. No. 15/398,462.
U.S. Notice of Allowance, dated Jan. 19, 2018, issued in U.S. Appl. No. 15/398,462.
U.S. Office Action, dated Jul. 17, 2002, issued in U.S. Appl. No. 09/975,074.
U.S. Notice of Allowance, dated Mar. 12, 2003, issued in U.S. Appl. No. 09/975,074.
U.S. Office Action, dated Feb. 8, 2005, issued in U.S. Appl. No. 10/649,351.
U.S. Final Office Action, dated Jul. 14, 2005, issued in U.S. Appl. No. 10/649,351.
U.S. Office Action, dated Dec. 30, 2005, issued in U.S. Appl. No. 10/649,351.
U.S. Notice of Allowance, dated Jul. 21, 2006, issued in U.S. Appl. No. 10/649,351.
U.S. Office Action, dated Jun. 22, 2004, issued in U.S. Appl. No. 10/435,010.
U.S. Notice of Allowance, dated Oct. 7, 2004, issued in U.S. Appl. No. 10/435,010.
U.S. Notice of Allowance, dated Jan. 19, 2005, issued in U.S. Appl. No. 10/435,010.
U.S. Office Action, dated Nov. 23, 2005, issued in U.S. Appl. No. 10/984,126.
U.S. Final Office Action, dated May 17, 2006, issued in U.S. Appl. No. 10/984,126.
U.S. Notice of Allowance, dated Aug. 25, 2006, issued in U.S. Appl. No. 10/984,126.
U.S. Office Action, dated Mar. 23, 2005, issued in U.S. Appl. No. 10/690,492.
U.S. Notice of Allowance, dated Sep. 14, 2005, issued in U.S. Appl. No. 10/690,492.
U.S. Office Action, dated Jun. 27, 2008, issued in U.S. Appl. No. 11/305,368.
U.S. Office Action, dated Apr. 3, 2009, issued in U.S. Appl. No. 11/305,368.
U.S. Notice of Allowance, dated Nov. 17, 2009, issued in U.S. Appl. No. 11/305,368.
U.S. Office Action, dated Jul. 12, 2005, issued in U.S. Appl. No. 10/815,560.
U.S. Final Office Action, dated Dec. 28, 2005, issued in U.S. Appl. No. 10/815,560.
U.S. Office Action, dated Apr. 17, 2006, issued in U.S. Appl. No. 10/815,560.
U.S. Office Action, dated Sep. 28, 2006, issued in U.S. Appl. No. 10/815,560.
U.S. Notice of Allowance dated Apr. 24, 2007, issued in U.S. Appl. No. 10/815,560.
U.S. Office Action, dated Aug. 21, 2008, issued in U.S. Appl. No. 11/265,531.
U.S. Final Office Action, dated Feb. 26, 2009, issued in U.S. Appl. No. 11/265,531.
U.S. Notice of Allowance, dated May 4, 2009, issued in U.S. Appl. No. 11/265,531.
U.S. Office Action, dated Nov. 23, 2010, issued in U.S. Appl. No. 12/538,770.
U.S. Notice of Allowance, dated Jun. 30, 2011, issued in U.S. Appl. No. 12/538,770.
U.S. Office Action, dated Oct. 16, 2008, issued in U.S. Appl. No. 11/349,035.
U.S. Final Office Action, dated Feb. 25, 2009, issued in U.S. Appl. No. 11/349,035.
U.S. Office Action, dated Jun. 4, 2009, issued in U.S. Appl. No. 11/349,035.
U.S. Final Office Action, dated Nov. 20, 2009, issued in U.S. Appl. No. 11/349,035.
U.S. Notice of Allowance, dated Mar. 2, 2010, issued in U.S. Appl. No. 11/349,035.
U.S. Office Action, dated Sep. 29, 2008, issued in U.S. Appl. No. 11/782,570.
U.S. Final Office Action, dated Apr. 28, 2009, issued in U.S. Appl. No. 11/782,570.
U.S. Notice of Allowance, dated Sep. 17, 2009, issued in U.S. Appl. No. 11/782,570.
U.S. Office Action, dated Jan. 25, 2011, issued in U.S. Appl. No. 12/636,616.
U.S. Final Office Action, dated Jun. 15, 2011, issued in U.S. Appl. No. 12/636,616.
U.S. Notice of Allowance, dated Sep. 30, 2011, issued in U.S. Appl. No. 12/636,616.
U.S. Office Action, dated Jun. 24, 2009, issued in U.S. Appl. No. 12/030,645.
U.S. Final Office Action, dated Jan. 13, 2010, issued in U.S. Appl. No. 12/030,645.
U.S. Final Office Action, dated Jul. 23, 2010, issued in U.S. Appl. No. 12/030,645.
U.S. Notice of Allowance and Fee Due, dated Jan. 24, 2011, issued in U.S. Appl. No. 12/030,645.
U.S. Office Action, dated Aug. 6, 2012, issued in U.S. Appl. No. 13/095,734.
Notice of Allowance dated Dec. 3, 2012, issued in U.S. Appl. No. 13/095,734.
U.S. Office Action, dated Aug. 5, 2009, issued in U.S. Appl. No. 11/951,236.
U.S. Final Office Action, dated Jan. 26, 2010 from U.S. Appl. No. 11/951,236.
U.S. Notice of Allowance, dated Apr. 6, 2010, issued in U.S. Appl. No. 11/951,236.
U.S. Office Action, dated Jun. 30, 2011, issued in U.S. Appl. No. 12/829,119.
U.S. Final Office Action, dated Nov. 17, 2011, issued in U.S. Appl. No. 12/829,119.
U.S. Office Action, dated Apr. 19, 2012, issued in U.S. Appl. No. 12/829,119.
U.S. Notice of Allowance, dated Aug. 7, 2012, issued in U.S. Appl. No. 12/829,119.
U.S. Office Action, dated Jun. 11, 2009, issued in U.S. Appl. No. 11/963,698.
U.S. Final Office Action, dated Dec. 9, 2009, issued in U.S. Appl. No. 11/963,698.
U.S. Office Action, dated Jun. 11, 2010, issued in U.S. Appl. No. 11/963,698.
U.S. Final Office Action, dated Dec. 30, 2010, issued in U.S. Appl. No. 11/963,698.
U.S. Notice of Allowance, dated Sep. 2, 2011, issued in U.S. Appl. No. 11/963,698.
U.S. Office Action, dated Apr. 16, 2012, issued in U.S. Appl. No. 13/276,170.
U.S. Notice of Allowance, dated Oct. 4, 2012, issued in U.S. Appl. No. 13/276,170.
U.S. Notice of Allowance, dated Jul. 25, 2011, issued in U.S. Appl. No. 12/363,330.
U.S. Office Action dated Oct. 21, 2009, issued in U.S. Appl. No. 12/202,126.
U.S. Final Office Action, dated May 7, 2010, issued in U.S. Appl. No. 12/202,126.
U.S. Office Action, dated Jul. 26, 2010 issued in U.S. Appl. No. 12/202,126.
U.S. Final Office Action, dated Feb. 7, 2011, issued in U.S. Appl. No. 12/202,126.
U.S. Office Action, dated Jan. 7, 2013, issued in U.S. Appl. No. 12/202,126.
U.S. Notice of Allowance, dated Jun. 7, 2013, issued in U.S. Appl. No. 12/202,126.
U.S. Office Action, dated May 3, 2010, issued in U.S. Appl. No. 12/407,541.
U.S. Final Office Action, dated Oct. 19, 2010, issued in U.S. Appl. No. 12/407,541.

(56) References Cited

OTHER PUBLICATIONS

U.S. Office Action, dated May 2, 2011, issued in U.S. Appl. No. 12/407,541.
U.S. Notice of Allowance, dated Sep. 19, 2011, issued in U.S. Appl. No. 12/407,541.
U.S. Office Action, dated Mar. 6, 2012, issued in U.S. Appl. No. 13/244,016.
U.S. Notice of Allowance dated Nov. 29, 2012, issued in U.S. Appl. No. 13/244,016.
U.S. Office Action, dated Jun. 14, 2011, issued in U.S. Appl. No. 12/556,490.
U.S. Notice of Allowance, dated Mar. 2, 2012, issued in U.S. Appl. No. 12/556,490.
U.S. Office Action, dated May 13, 2011, issued in U.S. Appl. No. 12/755,248.
U.S. Office Action, dated Oct. 28, 2011, issued in U.S. Appl. No. 12/755,248.
U.S. Final Office Action, dated Apr. 30, 2012, issued in U.S. Appl. No. 12/755,248.
U.S. Office Action, dated Feb. 15, 2013, issued in U.S. Appl. No. 12/755,248.
U.S. Office Action dated Dec. 18, 2012, issued in U.S. Appl. No. 12/723,532.
U.S. Office Action dated Jul. 18, 2013, issued in U.S. Appl. No. 12/723,532.
U.S. Notice of Allowance dated Dec. 24, 2013, issued in U.S. Appl. No. 12/723,532.
U.S. Office Action, dated Feb. 16, 2012, issued in U.S. Appl. No. 12/755,259.
U.S. Final Office Action, dated Sep. 12, 2012, issued in U.S. Appl. No. 12/755,259.
U.S. Notice of Allowance, dated Jul. 10, 2013, issued in U.S. Appl. No. 12/755,259.
U.S. Notice of Allowance dated Sep. 4, 2013 issued in U.S. Appl. No. 12/755,259.
U.S. Office Action, dated Dec. 18, 2014, issued in U.S. Appl. No. 14/097,160.
U.S. Final Office Action, dated Jun. 2, 2015, issued in U.S. Appl. No. 14/097,160.
U.S. Notice of Allowance, dated Sep. 9, 2015, issued in U.S. Appl. No. 14/097,160.
U.S. Office Action, dated Jul. 7, 2016, issued in U.S. Appl. No. 14/989,444.
U.S. Notice of Allowance, dated Jan. 20, 2017, issued in U.S. Appl. No. 14/989,444.
U.S. Office Action, dated May 10, 2012, issued in U.S. Appl. No. 13/020,748.
U.S. Final Office Action, dated Nov. 16, 2012, issued in U.S. Appl. No. 13/020,748.
U.S. Office Action, dated Feb. 24, 2014, issued in U.S. Appl. No. 13/020,748.
U.S. Final Office Action, dated Jul. 2, 2014, issued in U.S. Appl. No. 13/020,748.
U.S. Office Action, dated Dec. 23, 2014, issued in U.S. Appl. No. 13/851,885.
U.S. Notice of Allowance, dated Aug. 3, 2016, issued in U.S. Appl. No. 13/851,885.
U.S. Notice of Allowance, dated Dec. 14, 2016, issued in U.S. Appl. No. 13/851,885.
U.S. Notice of Allowance, dated Mar. 24, 2017, issued in U.S. Appl. No. 13/851,885.
U.S. Office Action, dated Dec. 18, 2014, issued in U.S. Appl. No. 14/502,817.
U.S. Final Office Action, dated Jul. 17, 2015, issued in U.S. Appl. No. 14/502,817.
U.S. Notice of Allowance, dated Sep. 25, 2015, issued in U.S. Appl. No. 14/502,817.
U.S. Office Action, dated Sep. 2, 2016, issued in U.S. Appl. No. 14/965,806.
U.S. Final Office Action, dated Apr. 14, 2017, issued in U.S. Appl. No. 14/965,806.
U.S. Office Action, dated Sep. 11, 2017, issued in U.S. Appl. No. 14/965,806.
U.S. Office Action, dated Sep. 18, 2014, issued in U.S. Appl. No. 13/928,216.
U.S. Notice of Allowance, dated Jan. 22, 2015, issued in U.S. Appl. No. 13/928,216.
U.S. Office Action, dated Jun. 20, 2013, issued in U.S. Appl. No. 13/560,688.
U.S. Final Office Action, dated Feb. 14, 2014, issued in U.S. Appl. No. 13/560,688.
U.S. Notice of Allowance, dated Nov. 4, 2014, issued in U.S. Appl. No. 13/560,688.
U.S. Office Action, dated May 29, 2015, issued in U.S. Appl. No. 13/949,092.
U.S. Final Office Action, dated Jan. 14, 2016, issued in U.S. Appl. No. 13/949,092.
U.S. Office Action, dated Sep. 19, 2016, issued in U.S. Appl. No. 13/949,092.
U.S. Final Office Action, dated May 18, 2017, issued in U.S. Appl. No. 13/949,092.
U.S. Notice of Allowance, dated Jan. 12, 2018, issued in U.S. Appl. No. 13/949,092.
U.S. Office Action, dated Jun. 14, 2013, issued in U.S. Appl. No. 13/633,798.
U.S. Final Office Action, dated Nov. 26, 2013, issued in U.S. Appl. No. 13/633,798.
U.S. Notice of Allowance, dated May 23, 2014, issued in U.S. Appl. No. 13/633,798.
Taiwan Examination Report, dated Jun. 22, 2017, issued in Application No. TW 103113287.
Chinese First Office Action dated Jun. 2, 2017 issued in Application No. CN 201410856793.7.
Chinese Second Office Action dated Feb. 5, 2018 issued in Application No. CN 201410856793.7.
PCT Search Report and Written Opinion, dated Jan. 19, 2005, issued in PCT/US2004/006940.
Korean First Notification of Provisional Rejection, dated Dec. 8, 2010, issued in Application No. KR 2004-0036346.
Korean Office Action, dated Jun. 13, 2011, issued in Application No. KR 2011-0032098.
Korean Office Action, dated Nov. 24, 2010, issued in Application No. KR 10-2004-0013210.
Korean Office Action, dated Mar. 28, 2013, issued in Application No. KR 10-2007-0012027.
Japanese Office Action dated May 7, 2013, issued in Application No. JP 2008-310322.
Japanese Office Action dated Sep. 3, 2013, issued in Application No. JP 2008-325333.
PCT International Search Report and Written Opinion, dated Apr. 12, 2010, issued in PCT/US2009/055349.
PCT International Preliminary Report on Patentability and Written Opinion, dated Mar. 10, 2011, issued in PCT/US2009/055349.
Chinese First Office Action dated Sep. 18, 2012 issued in Application No. CN 200980133560.1.
Chinese Second Office Action dated Aug. 7, 2013 issued in Application No. CN 200980133560.1.
Chinese Third Office Action dated Apr. 22, 2014 issued in Application No. CN 200980133560.1.
Chinese Fourth Office Action dated Jan. 5, 2015 issued in Application No. CN 200980133560.1.
Chinese Fifth Office Action dated May 5, 2015 issued in Application No. CN 200980133560.1.
Japanese Office Action dated Dec. 3, 2013 issued in Application No. JP 2011-525228.
Korean Office Action dated Sep. 6, 2012 issued in Application No. KR 2011-7004322.
Korean Office Action dated Jul. 19, 2013 issued in Application No. KR 2011-7004322.
Korean Office Action dated Nov. 4, 2013 issued in Application No. KR 10-2013-7027117.

(56) References Cited

OTHER PUBLICATIONS

Korean Office Action dated Jun. 17, 2014 issued in Application No. KR 10-2013-7027117.
Japanese Office Action dated Jun. 17, 2014 issued in Application No. JP 2010-055163.
Korean Office Action dated Mar. 21, 2013 issued in Application No. KR 10-2010-0024905.
Taiwan Office Action dated Jun. 8, 2015 issued in Application No. TW 099107504.
Korean Notification of Provisional Rejection dated Jul. 17, 2012, issued in Application No. KR 2010-0087997.
Taiwan Office Action and Search Report dated Feb. 12, 2015 issued in Application No. TW 099130354.
Taiwan Office Action (Rejection Decision) dated Oct. 28, 2015 issued in Application No. TW 099130354.
Taiwan Search Report dated Nov. 30, 2016 issued in Application No. TW 099130354.
Japanese Office Action dated Mar. 4, 2014 issued in Application No. JP 2010-093522.
Korean Office Action dated Mar. 4, 2013 in Application No. KR 2010-0035449.
Taiwan Office Action dated Dec. 27, 2014 issued in Application No. TW 099111860.
Japanese Office Action dated Jul. 29, 2014 issued in Application No. JP 2010-093544.
Korean Second Office Action dated Jan. 25, 2014 in Application No. KR 10-2010-0035453.
Korean First Office Action dated Jul. 10, 2015 issued in Application No. KR 10-2014-0090283.
Taiwan Office Action dated Aug. 4, 2015 issued in Application No. TW 099111859.
Taiwan Office Action dated Jan. 10, 2017 issued in Application No. TW 105105984.
PCT International Search Report and Written Opinion, dated Jul. 26, 2013, issued in PCT/US2013/034167.
PCT International Preliminary Report on Patentability and Written Opinion, dated Oct. 9, 2014, issued in PCT/US2013/034167.
Chinese First Office Action dated Mar. 18, 2016 issued in Application No. CN 201380022693.8.
Chinese Second Office Action dated Jan. 23, 2017 issued in Application No. CN 201380022693.8.
Chinese Third Office Action dated Sep. 25, 2017 issued in Application No. CN 201380022693.8.
Japanese Notification of Reasons for Rejection dated Dec. 20, 2016 issued in Application No. JP 2015-503547.
Taiwan Office Action dated Oct. 25, 2016 issued in Application No. TW 102110947.
Taiwan Examination Report dated Dec. 26, 2016 issued in Application No. TW 102123248.
Taiwan Examination Report dated Oct. 26, 2016 issued in Application No. TW 102126976.
Chinese First Office Action dated Sep. 6, 2015 issued in Application No. CN 201310320848.8.
Chinese Second Office Action dated May 16, 2016 issued in Application No. CN 201310320848.8.
Taiwan Examination Report dated Oct. 26, 2016 issued in Application No. TW 102126696.
Taiwan Examination Report dated Mar. 16, 2017 issued in Application No. TW 102132433.
Becker, Jill (Apr. 7, 2003) "Diffusion barrier properties of tungsten nitride films grown by atomic layer deposition from bis(tert-butylimido)bis(dimethylamido)tungsten and ammonia," *Applied Physics Letters*, 82(14):2239-2241, [Retrieved online Dec. 13, 2013 at http://dx.doi.org/10.1063/1.1565699].
Bell et al. (Jan. 1996) "Batch Reactor Kinetic Studies of Tungsten LPCVD from Silane and Tungsten Hexafluoride", *J. Electrochem. Soc.*, 143(1):296-302.
Collins et al. (Jan. 21, 2003) "Pulsed Deposition of Ultra Thin Tungsten for Plugfill of High Aspect Ratio Contacts," Presentation made at Semicon Korea, 9 pages.

Diawara, Y. et al. (1993) "Rapid thermal annealing for reducing stress in tungsten x-ray mask absorber," http://dx.doi.org/10.1116/1.586673, *Journal of Vacuum Science & Technology B* 11:296-300 (per table of contents of journal).
Elam et al. (2001) "Nucleation and Growth During Tungsten Atomic Layer Deposition on $SiO_2$ Surfaces," *Thin Solid Films*, 13pp.
Fair, James A. (1983) Presentation by Inventor "Chemical Vapor Deposition of Refractory Metal Silicides," *GENUS Incorporated*, 27 pp.
George et al. (1996) "Surface Chemistry for atomic Layer Growth", *J. Phys. Chem*, 100(31):13121-13131.
Gonohe, Narishi (2002) "Tungsten Nitride Deposition by Thermal Chemical Vapor Deposition as Barrier Metal for Cu Interconnection," [http://www.jim.co.jp/journal/e/pdf3/43/07/1585.pdf], *Materials Transactions*, 43(7): 1585-1592.
Hoover, Cynthia (Jul. 2007) "Enabling Materials for Contact Metallization," *Praxair Electronic Materials R&D*, pp. 1-16.
Klaus et al. (2000) "Atomic layer deposition of tungsten using sequential surface chemistry with a sacrificial stripping reaction," *Thin Solid Films* 360:145-153.
Klaus et al. (2000) "Atomically Controlled Growth of Tungsten and Tungsten Nitride Using Sequential Surface Reactions," *Applied Surface Science*, pp. 162-163, 479-491.
Lai, Ken et al. (Jul. 17, 2000) "Tungsten chemical vapor deposition using tungsten hexacarbonyl: microstructure of as-deposited and annealed films," [http://dx.doi.org/10.1016/S0040-6090(00)00943-3], *Thin Solid Films*, 370:114-121.
Lai, Ken K. and Lamb, H. Henry (1995) "Precursors for Organometallic Chemical Vapor Deposition of Tungsten Carbide Films," *Chemistry Material*, 7(12):2284-2292.
Lee et al. (Jan. 21, 2003) "Pulsed Deposition of Ultra Thin Tungsten and its Application for Plugfill of High Aspect Ratio Contacts," Abstract, 1 page.
Li et al. (2002) "Deposition of $WN_xC_y$, Thin Films by ALCVD™ Method for Diffusion Barriers in Metallization," *IITC Conference Report*, 3 pp.
Manik. P, et al. (2012) "Fermi-level unpinning and low resistivity in contacts to n-type Ge with a thin ZnO interfacial layer," *App. Phys. Lett.* 101:182105-5.
Purchase of (ethylcyclopentadienyl) dicarbonylnitrosyltungsten from Praxair (2006).
Saito et al. (2001) "A Novel Copper Interconnection Technology Using Self Aligned Metal Capping Method," *IEEE*, 3pp.
Shioya, Yoshimi et al. (Dec. 1, 1985) "Analysis of stress in chemical vapor deposition tungsten silicide film," [Retrieved online Dec. 18, 2013 at http://dx.doi.org/10.1063/1.335552], *Journal of Applied Physics*, 58(11):4194-4199.
U.S. Office Action dated May 18, 2016 issued in U.S. Appl. No. 14/703,732.
U.S. Notice of Allowance dated Nov. 1, 2016 issued in U.S. Appl. No. 14/703,732.
U.S. Office Action dated Oct. 4, 2016 issued in U.S. Appl. No. 14/723,353.
U.S. Final Office Action dated Feb. 21, 2017 issued in U.S. Appl. No. 14/723,353.
U.S. Office Action dated Nov. 6, 2017 issued in U.S. Appl. No. 14/723,353.
U.S. Final Office Action dated Jun. 8, 2018 issued in U.S. Appl. No. 14/723,353.
Chinese First Office Action, dated Jun. 1, 2017, issued in Application No. CN 201510236179.5.
Chinese Second Office Action, dated Jan. 30, 2018 issued in Application No. CN 201510236179.5.
Chinese First Office Action, dated Sep. 29, 2017, issued in Application No. CN 201510293342.1.
Chinese Second Office Action, dated May 30, 2018, issued in Application No. CN 201510293342.1.
Chinese Office Action dated May 15, 2018 issued in Application No. CN 201610085046.7.
Ammerlaan et al.(1991) "Chemical vapour deposition of tungsten by $H_2$ reduction of $WCl_6$," *Applied Surface Science*, 53:24-29.

(56) References Cited

OTHER PUBLICATIONS

Ammerlaan et al. (Feb. 28, 1994) Thesis: "Kinetics and Characterization of Tungsten CVD Processes," *Delft University Press*, 180 pp.
Melliar-Smith et al. (Feb. 1974) "Chemically Vapor Deposited Tungsten for Semiconductor Metallizations," *J. Electrochem. Soc.* 121(2):298-303.
Pons et al. (2000) "Combined thermodynamic and mass transport modeling for material processing from the vapor phase," *Thin Solid Films*,365:264-274.
Landingham et al. (Feb. 22, 1969) "Fine-Grain Tungsten by Chemical Vapor Deposition," *Journal of the Less-Common Metals,* Elsevier Sequoia S.A., Lausanne—Printed in the Netherlands, 18:229-243.
Saeki et al. (1973) "Reaction process between tungsten hexachloride and hydrogen," *Journal of the Less-Common Metals,* Elsevier Sequoia S.A., Lausanne—Printed in The Netherlands, 33:313-316.
U.S. Appl. No. 15/958,662, filed Apr. 20, 2018, Bamnolker et al.
Taiwan First Office Action, dated Aug. 17, 2018 issued in Application No. TW 104114532.
Taiwan First Office Action, dated Nov. 28, 2018, issued in Application No. TW 104117319.
U.S. Office Action dated Jun. 11, 2019 issued in U.S. Appl. No. 14/723,353.
U.S. Office Action dated Apr. 4, 2019, issued in U.S. Appl. No. 15/958,662.
Chinese Third Office Action, dated Dec. 29, 2018 issued in Application No. CN 201510236179.5.
Chinese Fourth Office Action, dated Jul. 18, 2019 issued in Application No. CN 201510236179.5.
Japanese First Office Action, dated Jan. 22, 2019 issued in Application No. JP 2015-095549.
Taiwan Second Office Action, dated Apr. 23, 2019 issued in Application No. TW 104114532.
Chinese Third Office Action, dated Jan. 31, 2019, issued in Application No. CN 201510293342.1.
Chinese Fourth Office Action [Decision of Final Rejection], dated Jul. 18, 2019 issued in Application No. CN 201510293342.1.
Japanese First Office Action, dated Feb. 19, 2019, issued in Application No. JP 2015-109333.
Chinese Second Office Action dated Jan. 8, 2019, issued in Application No. CN 201610085046.7.
Taiwan First Office Action dated Sep. 19, 2019, issued in Application No. TW 105104238.
U.S. Notice of Allowance dated Sep. 6, 2019, issued in U.S. Appl. No. 15/958,662.

* cited by examiner

TUNGSTEN FOR WORDLINE APPLICATIONS

CROSS-REFERENCE TO RELATED APPLICATIONS

This application is a continuation of and claims priority to U.S. application Ser. No. 15/040,561, titled "TUNGSTEN FOR WORDLINE APPLICATIONS," filed Feb. 10, 2016, which claims the benefit of priority to U.S. Provisional Application No. 62/115,012, titled "TUNGSTEN FOR WORDLINE APPLICATIONS," filed Feb. 11, 2015, each of which is incorporated herein by reference in its entirety and for all purposes.

BACKGROUND

Tungsten (W) film deposition using chemical vapor deposition (CVD) techniques is an integral part of semiconductor fabrication processes. For example, tungsten films may be used as low resistivity electrical connections in the form of horizontal interconnects, vias between adjacent metal layers, and contacts between a first metal layer and the devices on a silicon substrate. In an example tungsten deposition process, a barrier layer is deposited on a dielectric substrate, followed by deposition of a thin nucleation layer of tungsten film. Thereafter, the remainder of the tungsten film is deposited on the nucleation layer as a bulk layer. Conventionally, the tungsten bulk layer is formed by the reduction of tungsten hexafluoride ($WF_6$) with hydrogen ($H_2$) in a chemical vapor deposition process.

Tungsten films may also be used in various memory applications, including in formation of buried wordline (bWL) architectures for dynamic random access memory (DRAM). In an example of bWL deposition, a tungsten layer may be deposited on a titanium nitride (TiN) layer to form a TiN/W bilayer by a CVD process using $WF_6$.

SUMMARY

Disclosed herein are methods of depositing tungsten on a substrate. In some embodiments, the methods include pulsing a reducing agent, wherein the reducing agent is boron (B)-containing, silicon (Si)-containing or germanium (Ge)-containing and pulsing a tungsten chloride precursor, wherein the tungsten chloride precursor is reduced by the reducing agent or a product thereof to form a multi-component tungsten-containing film containing one or more of B, Si, and Ge on the substrate.

In some embodiments the methods involve pulsing a third reactant to form a ternary tungsten-containing film. The third reactant may be a nitrogen-containing or carbon-containing reactant such that the ternary tungsten-containing film includes tungsten, one of silicon, germanium, and boron, and one or carbon and nitrogen. Quaternary and higher order films containing two or more of silicon, germanium, boron, carbon, and nitrogen may be formed. In some embodiments, the multi-component film is a binary film.

In some embodiments, the multi-component tungsten-containing film is a diffusion barrier for a wordline. In some embodiments, the multi-component tungsten-containing film is a work function layer for a metal gate.

In some embodiments, the substrate temperature during the tungsten chloride pulse is at least 400° C. In some embodiments, the substrate temperature during the tungsten chloride pulse is at least 450° C. In some embodiments, the substrate temperature during the tungsten chloride pulse is at least 500° C. In some embodiments, the substrate temperature during the tungsten chloride pulse is at least 550° C.

In some embodiments, the substrate temperature during the tungsten chloride and reducing agent pulses is at least 400° C. In some embodiments, the substrate temperature during the tungsten chloride and reducing agent pulses is at least 450° C. In some embodiments, the substrate temperature during the tungsten chloride and reducing agent pulses is at least 500° C. In some embodiments, the substrate temperature during the tungsten chloride and reducing agent pulses is at least 550° C.

The method may further include depositing a bulk tungsten (W) layer on the multi-component tungsten-containing film. In some embodiments, the bulk W layer is deposited by a chemical vapor deposition (CVD) reaction between a tungsten chloride precursor and a reducing agent.

The bulk layer may be deposited directly on the multi-component tungsten-containing film without an intervening layer in some embodiments.

According to various embodiments, the multi-component tungsten-containing film is deposited directly on an insulating film, such as an oxide or nitride film. In some embodiments, the method involves decomposition of the reducing agent to form a layer of B, Si, or Ge on the substrate.

Also provided are memory structures. In some embodiments, a memory structure may include a liner layer of a multi-component tungsten-containing film containing one or more of B, Si, and Ge; and a tungsten wordline. In some embodiments, a memory structure may include a work function layer of a multi-component tungsten-containing film containing one or more of B, Si, and Ge; and a metal gate.

These and other aspects are described further below with reference to the figures.

DETAILED DESCRIPTION

Figure 1:
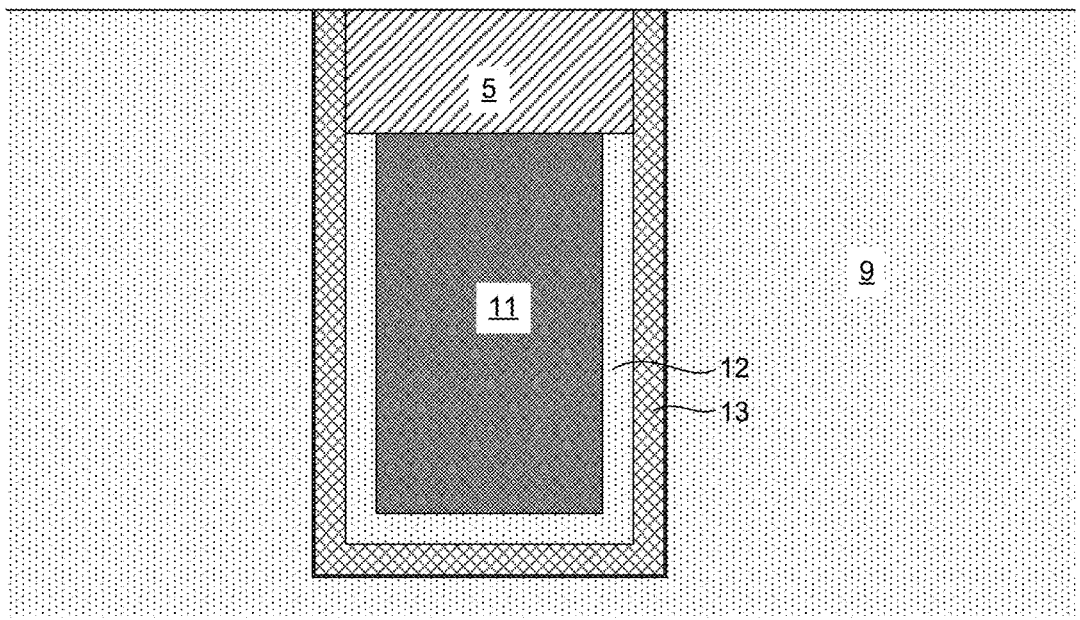
FIG. 1 depicts a schematic example of a dynamic random access memory (DRAM) architecture including a buried wordline (bWL) in a silicon substrate.

In the following description, numerous specific details are set forth to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments.

Semiconductor device fabrication often involves the deposition of tungsten films, for example in trenches or vias to form interconnects. In a conventional methods of depositing tungsten films, a nucleation tungsten layer is first deposited into a via or contact. In general, a nucleation layer is a thin conformal layer that serves to facilitate the subsequent formation of a bulk material thereon. The tungsten nucleation layer may be deposited to conformally coat the sidewalls and bottom of the feature. Conforming to the underlying feature bottom and sidewalls can be critical to support high quality deposition. Nucleation layers are often deposited using atomic layer deposition (ALD) or pulsed nucleation layer (PNL) methods.

In a PNL technique, pulses of reactant are sequentially injected and purged from the reaction chamber, typically by a pulse of a purge gas between reactants. A first reactant can be adsorbed onto the substrate, available to react with the next reactant. The process is repeated in a cyclical fashion until the desired thickness is achieved. PNL is similar to ALD techniques. PNL is generally distinguished from ALD by its higher operating pressure range (greater than 1 Torr) and its higher growth rate per cycle (greater than 1 monolayer film growth per cycle). Chamber pressure during PNL deposition may range from about 1 Torr to about 400 Torr. In the context of the description provided herein, PNL broadly embodies any cyclical process of sequentially adding reactants for reaction on a semiconductor substrate. Thus, the concept embodies techniques conventionally referred to as ALD. In the context of the disclosed embodiments, CVD embodies processes in which reactants are together introduced to a reactor for a vapor-phase reaction. PNL and ALD processes are distinct from CVD processes and vice versa.

After the tungsten nucleation layer is deposited, bulk tungsten is typically deposited by a chemical vapor deposition (CVD) process by reducing tungsten hexafluoride ($WF_6$) using a reducing agent such as hydrogen ($H_2$).

Conventional deposition of tungsten has involved the use of the fluorine-containing precursor $WF_6$. However, the use of $WF_6$ results in some incorporation of fluorine into the deposited tungsten film. As devices shrink, features become smaller and the detrimental effects electromigration as well as ion diffusion become more prominent, thereby causing device failure. The presence of fluorine can cause electromigration and/or fluorine diffusion into adjacent components, thereby reducing the performance of the device. Tungsten films containing traces of fluorine can thereby pose integration and reliability issues, as well as device performance issues related to the underlying films.

Disclosed herein are methods and related apparatus for formation of tungsten wordlines in memory devices. Also disclosed herein are methods and related apparatus for deposition of fluorine-free tungsten (FFW). FIG. 1 depicts a schematic example of a DRAM architecture including a buried wordline (bWL) 11 in a silicon substrate 9. The bWL is formed in a trench etched in the silicon substrate 9. Lining the trench is a conformal barrier layer 12 and an insulating layer 13 that is disposed between the conformal barrier layer 12 and the silicon substrate 9. In the example of FIG. 1, the insulating layer 13 may be a gate oxide layer, formed from a high-k dielectric material such as a silicon oxide or silicon nitride material.

In some embodiments disclosed herein the conformal barrier layer 12 is a tungsten-containing layer. In conventional tungsten (W) wordline architectures, titanium nitride (TiN) is used as a barrier. However, TiN/W wordline fill is limited by the resistivity scaling; because TiN has relatively high resistivity, as dimensions decrease and TiN conformal layers occupy a greater volume fraction of the trench, the resistance increases. According to various embodiments, the tungsten bWLs disclosed herein are free of TiN and other non-W barrier layers.

The conformal barrier layer 12 may include one or more of boron, silicon, and germanium. In some embodiments, the conformal barrier layer 12 is a binary compound such as $WB_x$, $WSi_x$, and $WGe_x$, where x is a number greater than zero. In some embodiments, the conformal barrier layer 12 may include carbon or nitrogen. In some embodiments, the conformal barrier layer 12 may include one or more of boron, silicon, and germanium, and one or both of carbon and nitride. In some embodiments, the conformal barrier layer 12 is a ternary compound such as $WB_xN_y$, $WSi_xN_y$, $WGe_xN_y$, $WSi_xC_y$, $WB_xC_y$, $WGe_xC_y$, etc., wherein x and y are numbers greater than zero. Quaternary and higher order compounds containing Si, B, Ge, N and C may also be used, with examples including $WB_xGe_yN_z$, $WGe_xC_yN_z$, etc. wherein x, y and z are numbers greater than zero.

Figure 2A:
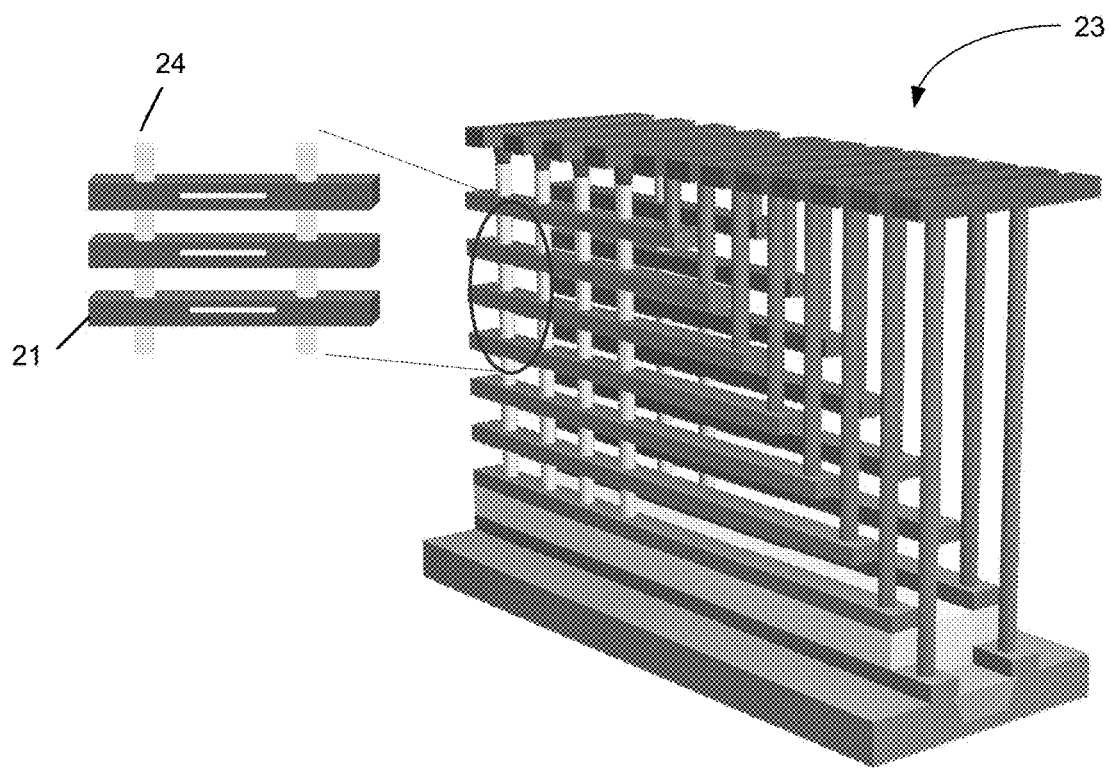
FIG. 2A depicts a schematic example of a three-dimensional NAND structure including tungsten wordlines.
Figure 2B:
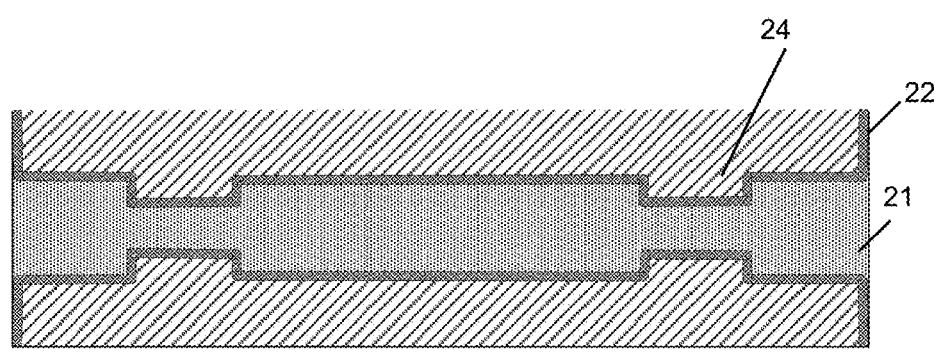
FIG. 2B is a two-dimensional rendering of three-dimensional features of a partially-fabricated 3D NAND structure including a tungsten wordline.

FIG. 2A depicts a schematic example of a wordline 21 in a 3D NAND structure 23. In FIG. 2B, a 2-D rendering of 3-D features of a partially-fabricated 3D NAND structure after tungsten fill, is shown including the wordline 21 and a conformal barrier layer 22. FIG. 2B is a cross-sectional depiction of a filled area with the pillar constrictions 24 shown in the figure representing constrictions that would be seen in a plan rather than cross-sectional view. The conformal barrier layer 22 may be a tungsten-containing layer as described above with respect to the conformal barrier layer 12 in FIG. 1. The tungsten-containing film may serve as a barrier layer and a nucleation layer for subsequent CVD W deposition.

In some embodiments, a tungsten-containing work function layer for a metal gate is provided, including a work function layer for a metal gate in a 3-D memory structure such as the 3-D NAND structure above.

Figure 2C:
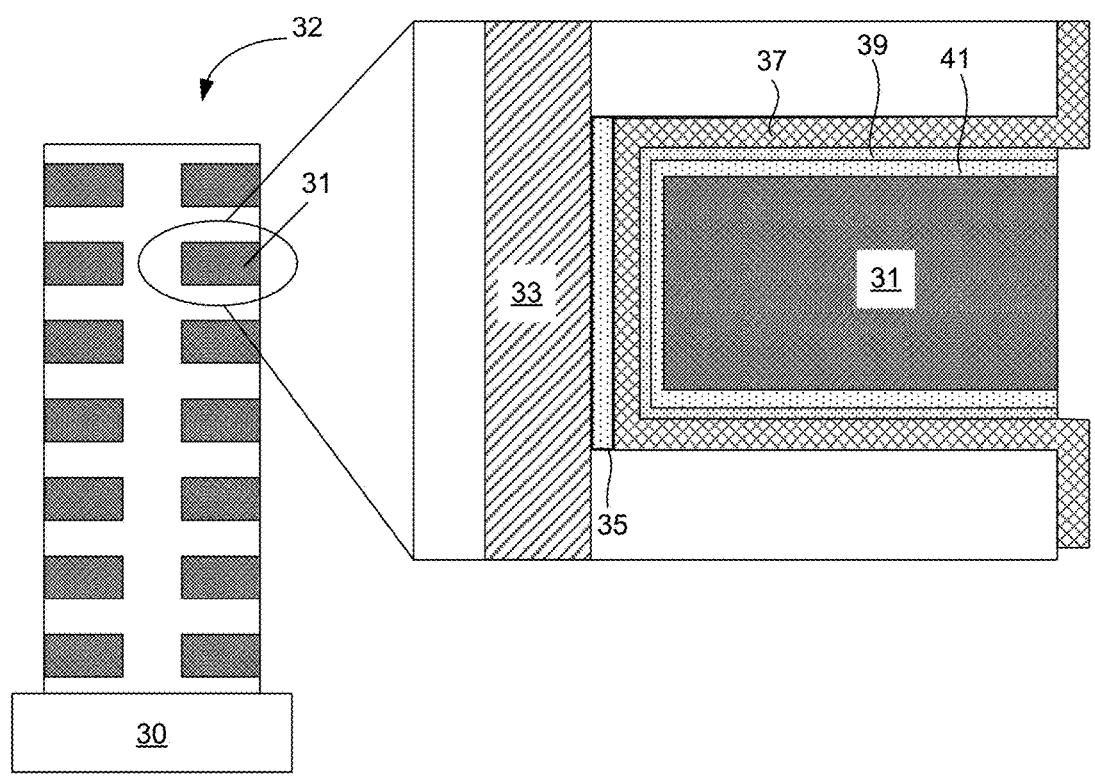
FIG. 2C shows a schematic example of a vertical NAND structure including a tungsten-containing work function layer.

FIG. 2C shows a schematic example of a VNAND structure 32 including metal gates 31 formed on a substrate 30, with an enlarged view of an example of a metal gate 31 and associated film stack also shown. The VNAND structure 32 includes a semiconducting channel 33, a tunnel dielectric layer 35, a charge storage layer 37, a work function layer 39, a blocking dielectric 41, and a metal gate 31.

Examples of work function layers in memory structures including those shown in the examples of FIGS. 2A-2C include films of a binary tungsten-containing compound such as $WB_x$, $WSi_x$, and $WGe_x$, where x is a number greater than zero. In some embodiments, the work function layer may include carbon or nitrogen. In some embodiments, the work function layer may include one or more of boron, silicon, and germanium, and one or both of carbon and nitride. In some embodiments, the work function layer is a ternary compound such as $WB_xN_y$, $WSi_xN_y$, $WGe_xN_y$, $WSi_xC_y$, $WB_xC_y$, $WGe_xC_y$, etc. Quaternary and higher order compounds containing Si, B, Ge, N and C may also be used. The tungsten-containing film may serve as a work function layer and a nucleation layer for subsequent CVD W deposition. The work function layer may be deposited on a dielectric material such as a gate oxide.

In some embodiments, the memory structures described with reference to FIGS. 2A-2C do not include TiN diffusion barriers or TiN work function layers.

Figure 3A:
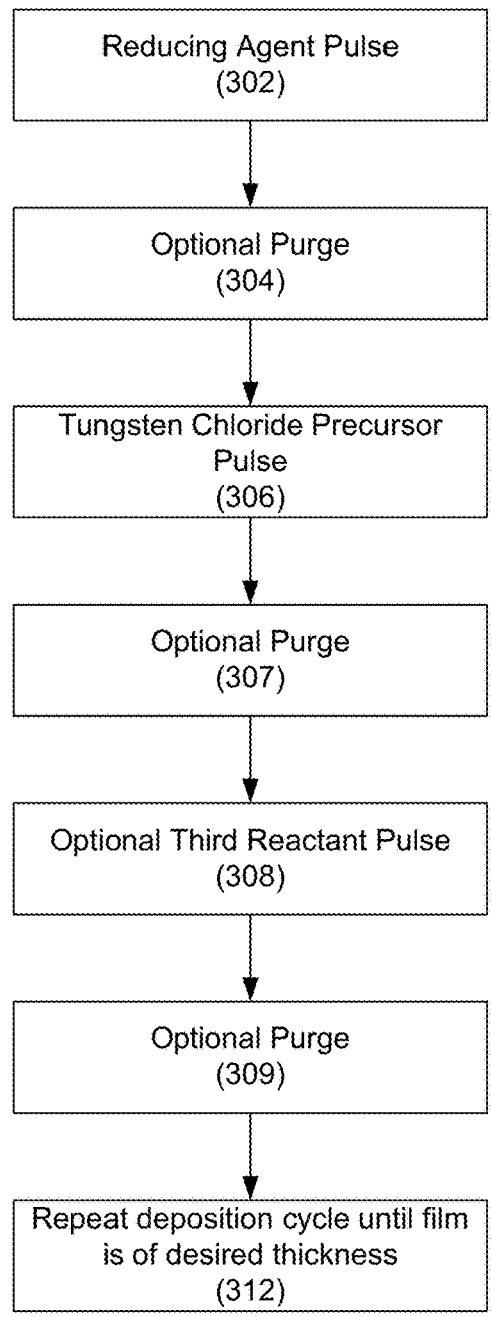
FIG. 3A shows an example of a method that may be used to form a tungsten-containing binary or ternary film.

FIG. 3A shows an example of a method that may be used to form a tungsten-containing binary or ternary film. First, a substrate is exposed to a reducing agent pulse (302). The substrate may be a partially-fabricated memory device in some embodiments. In some embodiments, a surface that is exposed to the reducing agent pulse on which the film is formed is a dielectric. According to various embodiments, the film may be formed on other types of surfaces including conducting and semiconducting surfaces.

The reducing agent employed in block 302 will reduce a tungsten-containing precursor employed in a subsequent operation as well as provide a compound to be incorporated into the resulting film. Examples of such reducing agents include boron-containing, silicon-containing, and germanium-containing reducing agents. Examples of boron-containing reducing agents include boranes such as $B_nH_{n+4}$, $B_nH_{n+6}$, $B_nH_{n+8}$, $B_nH_m$, where n is an integer from 1 to 10, and m is a different integer than m. In particular examples, diborane may be employed. Other boron-containing compounds may also be used, e.g., alkyl boranes, alkyl boron, aminoboranes $(CH_3)_2NB(CH_2)_2$, and carboranes such as $C_2B_nH_{n+2}$. Examples of silicon-containing compounds include silanes such as $SiH_4$ and $Si_2H_6$. Examples of germanium-containing compounds include germanes, such as $Ge_nH_{n+4}$, $Ge_nH_{n+6}$, $Ge_nH_{n+8}$, and $Ge_nH_m$, where n is an integer from 1 to 10, and n is a different integer than m. Other germanium-containing compounds may also be used, e.g., alkyl germanes, alkyl germanium, aminogermanes and carbogermanes.

According to various embodiments, block 302 may involve adsorption of a thin layer of thermally decomposed elemental boron, silicon or germanium onto the surface of the substrate. In some embodiments, block 302 may involve adsorption of a precursor molecule onto substrate surface.

Next, the chamber in which the substrate sits may be optionally purged (304). A purge pulse or an evacuation can be employed to remove any byproduct, if present, and unadsorbed precursor. This is followed by a pulse of a tungsten chloride precursor (306). Tungsten chloride precursors include $WCl_2$, $WCl_4$, $WCl_5$ and $WCl_6$, as well as mixtures of these. In some embodiments, the tungsten chloride precursor is tungsten hexachloride ($WCl_6$), tungsten pentachloride ($WCl_5$) or a mixture thereof. An optional purge (307) may be performed after block 306 as well. The tungsten precursor is reduced by the reducing agent (or a decomposition or reaction product thereof) to form the multi-component film.

A deposition cycle will typically deposit a portion of the tungsten-containing layer. After block 307, a deposition cycle may be complete in some implementations with the deposited film being a tungsten-containing binary film such as $WB_x$, $WSi_x$, and $WGe_x$, where x is greater than zero. In such embodiments, the process may proceed to block 312 with repeating the cycle of blocks 302-307 until the desired thickness is deposited. Example growth rates may be about 100 Å per cycle.

In some embodiments, the process will proceed with optionally introducing a third reactant (308). The third reactant will generally contain an element to be introduced into the film, such as carbon or nitrogen. Examples of nitrogen-containing reactants include $N_2$, $NH_3$, and $N_2H_4$. Examples of carbon-containing reactants include $CH_4$ and $C_2H_2$. An optional purge (309) may follow. The process may then proceed to block 312 with repeating the deposition cycle.

Examples of ternary films including nitrogen or carbon are given above. In some embodiments, a film may include both nitrogen and carbon (e.g., WSiCN).

According to various embodiments, the multi-component tungsten film may have the following atomic percentages: W about 5% to 90%, B/Ge/Si about 5% to 60%, C/N about 5% to 80%. In some embodiments, the multi-component films have the following atomic percentages: W about 15% to about 80%; B/Ge/Si: about 15% to about 50%; and C/N about 20% to about 50%. According to various embodiments, the multi-component tungsten film is at least 50% tungsten.

According to various embodiments, the deposition is relatively high, e.g., between 400° C. and 650° C., including between 450° C. and 600° C., and in some embodiments greater than about 500° C. This facilitates tungsten chloride reduction and also permits incorporation of B, Si, or Ge into the binary film. The low end of the range is generally limited by the temperature at which the tungsten chloride compound can be reduced at reasonable reaction rates, with the temperature generally being higher than tungsten fluoride reduction. The high end of the range may be limited by thermal budget considerations. In some embodiments, any one or more of blocks 302, 306, and 308 may be performed at a different temperature than any of the other blocks. Examples of a process in which a reducing agent pulse is performed at a lower temperature than a subsequent tungsten chloride pulse are described in U.S. patent application Ser. No. 14/703,732, incorporated by reference herein. Similar temperature control may be employed in embodiments of FIG. 3A. In certain embodiments, transitioning from block 302 to block 306 and from block 306 to block 308 involves moving the substrate from one deposition station to another in a multi-station chamber. Still further, each of block 302, block 306, and block 308 may be performed in a different station of the same multi-station chamber.

In some embodiments, electrical properties such as work function of the binary or ternary film may be tuned by introducing nitrogen or carbon. Similarly, the amount of reducing agent may be modulated (by modulating dosage amount and/or pulse time) to tune the amount of B, Si, or Ge that is incorporated into the film. Still further, any one or two of blocks 302, 306 and 308 may be performed more than once per cycle to tune the relative amounts of the tungsten and the other components of the binary or ternary films and thus their physical, electrical, and chemical characteristics. Examples of different cycles for forming a ternary WBN film are described in U.S. Publication No. 20140027664, which is incorporated by reference herein. In some embodiments, the deposited tungsten-containing film has an effective work function of about 4.5-4.8 eV.

Figure 3B:
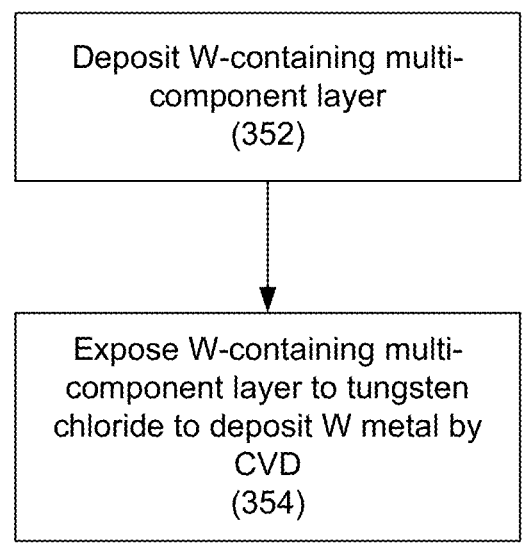
FIG. 3B shows an example of a method that may be used to fill a feature.

FIG. 3B shows an example of a method that may be used to fill a feature. First, a tungsten-containing multi-component layer is deposited (352). The multi-component layer may include W, one or more of B, Si, and Ge, and, optionally, one or more of C and N. Examples include $WB_x$, $WSi_x$, and $WGe_x$, $WB_xN_y$, $WSi_xN_y$, $WGe_xN_y$, $WSi_xC_y$, $WB_xC_y$, $WGe_xC_y$, where x and y are greater than zero. The film may be deposited as described above with respect to FIG. 3A.

Next, the tungsten-containing multi-component layer may be exposed to a tungsten chloride precursor to deposit W metal by CVD. In contrast to block 352, the CVD-deposited W is generally pure tungsten, i.e., with no more than trace amounts of impurities. In some embodiments, the film is at least 95% W. The layer deposited in block 352 can function as a nucleation layer for the CVD W deposition in block 354.

Block 354 may fill a feature on a substrate, including vertical features, such as in tungsten vias and bWLs, and horizontal features, such as VNAND wordlines. As indicated above, the methods performed with respect to FIGS. 3A and 3B generally do not include fluorine-containing precursors.

Example substrate temperatures are as low as 450° C. and may be as high as 650° C. during the CVD reaction. In certain embodiments, the tungsten chloride precursor is $WCl_5$ or $WCl_6$. In certain embodiments, the reducing agent is hydrogen gas, though other reducing agents may be used, including silanes, boranes, and germanes. In some embodiments, CVD may be implemented in various stages, such as a low temperature stage and a high temperature stage. In certain embodiments, the CVD operation may take place in multiple stages, with multiple periods of continuous and simultaneous flow of reactants separated by periods of one or more reactant flows diverted.

An inert carrier gas may be used to deliver one or more of the reactant streams in blocks 352 and 354, which may or may not be pre-mixed. In various embodiments, the precursors are introduced using argon as a carrier gas. Other carrier gases may be used as appropriate. An inert gas such as argon or another gas such as nitrogen, or a combination thereof may be provided as the background gas simultaneously with the reducing gases or the $WCl_5$ or $WCl_6$ gases. In some embodiments, the background gas flow is continuous, i.e., it is not switched on and off throughout blocks 352 and 354.

Unlike PNL or ALD processes, block 354 may generally involve introducing the reactants continuously until the desired amount is deposited. In certain embodiments, the CVD operation may take place in multiple stages, with multiple periods of continuous and simultaneous flow of reactants separated by periods of one or more diverted reactant flows. Flows may also be pulsed for a pulse time between about 1 second and about 2 seconds. In some embodiments, the reactants are continuously flowed for a time between about 400 seconds and about 600 seconds. Example ranges of chamber pressure during CVD deposition may range from about 10 Torr to about 500 Torr, or about 40 Torr.

In certain embodiments, transitioning from block 352 to block 354 involves moving the substrate from one deposition station to another in a multi-station chamber.

Apparatus

Any suitable chamber may be used to implement the disclosed embodiments. Example deposition apparatuses include various systems, e.g., ALTUS® and ALTUS® Max, available from Lam Research Corp., of Fremont, Calif., or any of a variety of other commercially available processing systems. The process can be performed on multiple deposition stations in parallel.

In some embodiments, the tungsten nucleation process is performed at a first station that is one of two, five, or even more deposition stations positioned within a single deposition chamber. In some embodiments, various steps for the nucleation process are performed at two different stations of a deposition chamber. For example, the substrate may be exposed to diborane ($B_2H_6$) in a first station using an individual gas supply system that creates a localized atmosphere at the substrate surface, and then the substrate may be transferred to a second station to be exposed to a precursor such as tungsten hexachloride ($WCl_6$) to deposit the nucleation layer. In some embodiments, the substrate may then be transferred back to the first station for a second exposure of diborane or to a third station for a third reactant exposure. Then the substrate may be transferred to the second station for exposure to $WCl_6$ (or other tungsten chloride) to complete tungsten nucleation and proceed with bulk tungsten deposition in the same or different station. One or more stations can then be used to perform chemical vapor deposition (CVD) as described above.

Figure 4:
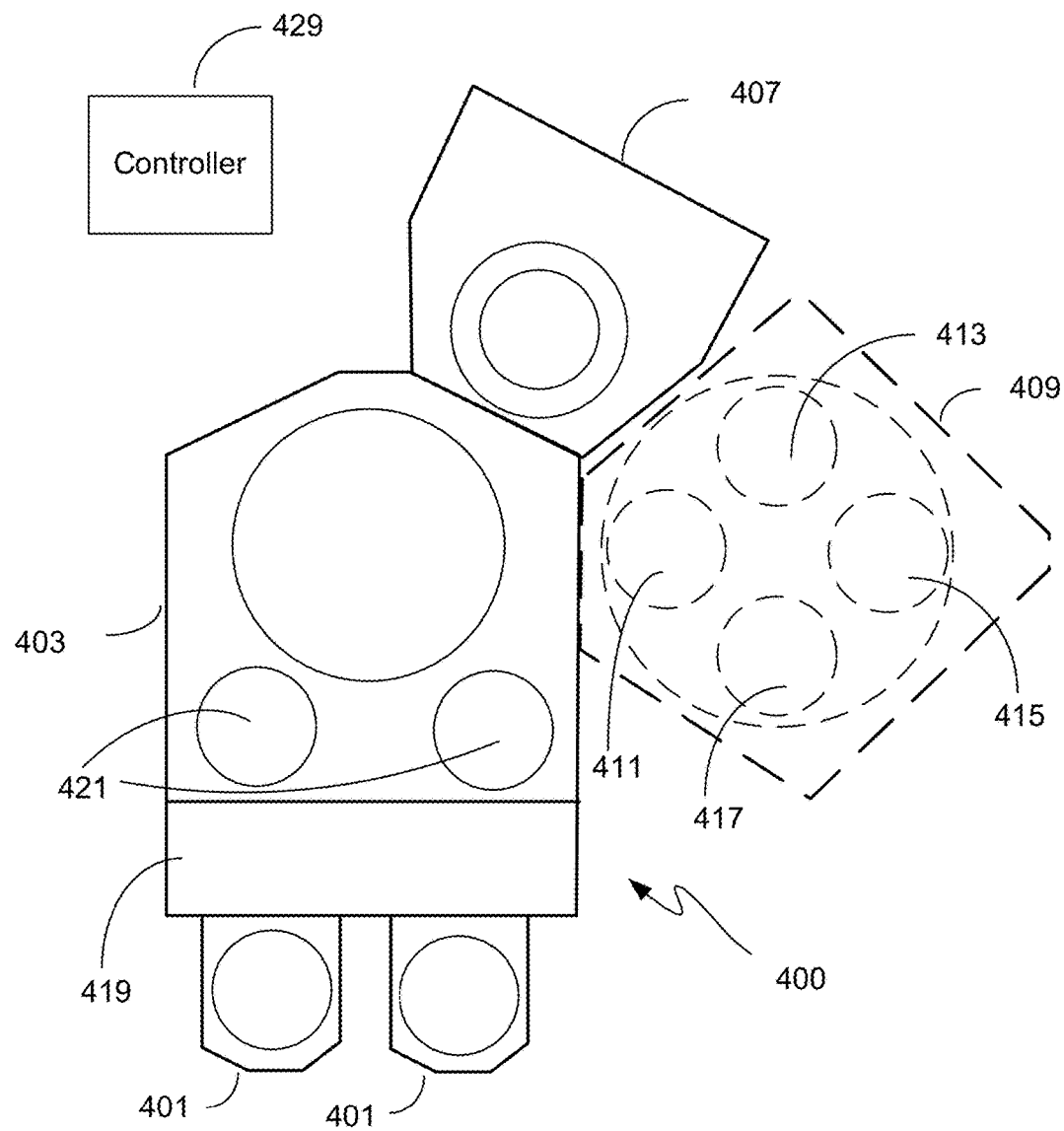
FIG. 4 is a block diagram of a processing system suitable for conducting tungsten deposition processes in accordance with embodiments of the invention.

FIG. 4 is a block diagram of a processing system suitable for conducting tungsten deposition processes in accordance with embodiments of the invention. The system 400 includes a transfer module 403. The transfer module 403 provides a clean, pressurized environment to minimize the risk of contamination of substrates being processed as they are moved between the various reactor modules. Mounted on the transfer module 403 is a multi-station reactor 409 capable of performing nucleation layer deposition, which may be referred to as pulsed nucleation layer (PNL) deposition, as well as CVD deposition according to embodiments of the invention. Chamber 409 may include multiple stations 411, 413, 415, and 417 that may sequentially perform these operations. For example, chamber 409 could be configured such that stations 411 and 413 perform PNL deposition, and stations 413 and 415 perform CVD. Each deposition station may include a heated wafer pedestal and a showerhead, dispersion plate or other gas inlet.

Also mounted on the transfer module 403 may be one or more single or multi-station modules 407 capable of performing plasma or chemical (non-plasma) pre-cleans. The module may also be used for various other treatments, e.g., reducing agent soaking. The system 400 also includes one or more (in this case two) wafer source modules 401 where wafers are stored before and after processing. An atmospheric robot (not shown) in the atmospheric transfer chamber 419 first removes wafers from the source modules 401 to loadlocks 421. A wafer transfer device (generally a robot arm unit) in the transfer module 403 moves the wafers from loadlocks 421 to and among the modules mounted on the transfer module 403.

In certain embodiments, a system controller 429 is employed to control process conditions during deposition. The controller will typically include one or more memory devices and one or more processors. The processor may include a CPU or computer, analog and/or digital input/output connections, stepper motor controller boards, etc.

The controller may control all of the activities of the deposition apparatus. The system controller executes system control software including sets of instructions for controlling the timing, mixture of gases, chamber pressure, chamber temperature, wafer temperature, radio frequency (RF) power levels if used, wafer chuck or pedestal position, and other parameters of a particular process. Other computer programs stored on memory devices associated with the controller may be employed in some embodiments.

Typically there will be a user interface associated with the controller. The user interface may include a display screen, graphical software displays of the apparatus and/or process conditions, and user input devices such as pointing devices, keyboards, touch screens, microphones, etc.

System control logic may be configured in any suitable way. In general, the logic can be designed or configured in hardware and/or software. The instructions for controlling the drive circuitry may be hard coded or provided as software. The instructions may be provided by "programming." Such programming is understood to include logic of any form, including hard coded logic in digital signal processors, application-specific integrated circuits, and other devices which have specific algorithms implemented as hardware. Programming is also understood to include software or firmware instructions that may be executed on a general purpose processor. System control software may be coded in any suitable computer readable programming language. Alternatively, the control logic may be hard coded in the controller. Applications Specific Integrated Circuits, Programmable Logic Devices (e.g., field-programmable gate arrays, or FPGAs) and the like may be used for these purposes. In the following discussion, wherever "software" or "code" is used, functionally comparable hard coded logic may be used in its place.

The computer program code for controlling the deposition and other processes in a process sequence can be written in any conventional computer readable programming language: for example, assembly language, C, C++, Pascal, Fortran or others. Compiled object code or script is executed by the processor to perform the tasks identified in the program.

The controller parameters relate to process conditions such as, for example, process gas composition and flow rates, temperature, pressure, plasma conditions such as RF power levels and the low frequency RF frequency, cooling gas pressure, and chamber wall temperature. These parameters are provided to the user in the form of a recipe, and may be entered utilizing the user interface.

Signals for monitoring the process may be provided by analog and/or digital input connections of the system controller. The signals for controlling the process are output on the analog and digital output connections of the deposition apparatus.

The system software may be designed or configured in many different ways. For example, various chamber component subroutines or control objects may be written to control operation of the chamber components necessary to carry out the inventive deposition processes. Examples of programs or sections of programs for this purpose include substrate positioning code, process gas control code, pressure control code, heater control code, and plasma control code.

A substrate positioning program may include program code for controlling chamber components that are used to load the substrate onto a pedestal or chuck and to control the spacing between the substrate and other parts of the chamber such as a gas inlet and/or target. A process gas control program may include code for controlling gas composition and flow rates and optionally for flowing gas into the chamber prior to deposition in order to stabilize the pressure in the chamber. A pressure control program may include code for controlling the pressure in the chamber by regulating, e.g., a throttle valve in the exhaust system of the chamber. A heater control program may include code for controlling the current to a heating unit that is used to heat the substrate. Alternatively, the heater control program may control delivery of a heat transfer gas such as helium to the wafer chuck.

Examples of chamber sensors that may be monitored during deposition include mass flow controllers, pressure sensors such as manometers, and thermocouples located in pedestal or chuck. Appropriately programmed feedback and control algorithms may be used with data from these sensors to maintain desired process conditions. The foregoing describes implementation of embodiments of the invention in a single or multi-chamber semiconductor processing tool.

The foregoing describes implementation of disclosed embodiments in a single or multi-chamber semiconductor processing tool. The apparatus and process described herein may be used in conjunction with lithographic patterning tools or processes, for example, for the fabrication or manufacture of semiconductor devices, displays, LEDs, photovoltaic panels, and the like. Typically, though not necessarily, such tools/processes will be used or conducted together in a common fabrication facility. Lithographic patterning of a film typically comprises some or all of the following steps, each step provided with a number of possible tools: (1) application of photoresist on a workpiece, i.e., substrate, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper.

CONCLUSION

Although the foregoing embodiments have been described in some detail for purposes of clarity of understanding, it will be apparent that certain changes and modifications may be practiced within the scope of the appended claims. It should be noted that there are many alternative ways of implementing the processes, systems, and apparatus of the present embodiments. Accordingly, the present embodiments are to be considered as illustrative and not restrictive, and the embodiments are not to be limited to the details given herein.

What is claimed is:

1. A method comprising:
   depositing a multi-component tungsten-containing diffusion barrier layer on a dielectric surface of a substrate, wherein depositing the multi-component tungsten-containing diffusion barrier layer comprises exposing the substrate to alternating pulses of a reducing agent and tungsten chloride, wherein the multi-component tungsten-containing diffusion barrier layer comprises between 5% and 60% (atomic) Si; and
   depositing a bulk tungsten layer on the multi-component tungsten-containing diffusion barrier layer.

2. The method of claim 1, wherein the between 5% and 60% (atomic) Si is provided by the reducing agent.

3. The method of claim 1, wherein the multi-component tungsten-containing diffusion barrier layer is a ternary or quaternary tungsten-containing film.

4. The method of claim 3, further comprising pulsing a third reactant to form the multi-component tungsten-containing diffusion barrier layer.

5. The method of claim 4, wherein the third reactant is a nitrogen-containing reactant and the multi-component tungsten-containing diffusion barrier layer comprises nitrogen provided by the nitrogen-containing reactant.

6. The method of claim 4, wherein the third reactant is a carbon-containing reactant and the multi-component tungsten-containing diffusion barrier layer comprises nitrogen provided by the carbon-containing reactant.

7. The method of claim 1, wherein the multi-component tungsten-containing diffusion barrier layer is a binary film.

8. The method of claim 1, wherein the substrate temperature during the tungsten chloride pulses is at least 400° C.

9. The method of claim 1, wherein the substrate temperature during the tungsten chloride pulses is at least 450° C.

10. The method of claim 1, wherein the substrate temperature during the tungsten chloride pulses is at least 500° C.

11. The method of claim 1, wherein the substrate temperature during the reducing agent and tungsten chloride pulses is at least 400° C.

12. The method of claim 1, wherein the substrate temperature during the reducing agent and tungsten chloride pulses is at least 450° C.

13. The method of claim 1, wherein the substrate temperature during the reducing agent and tungsten chloride pulses is at least 500° C.

14. The method of claim 1, wherein depositing the bulk tungsten layer comprises a chemical vapor deposition (CVD) reaction between a tungsten chloride precursor and a reducing agent.

15. The method of claim 1, wherein the bulk tungsten layer is deposited directly on the multi-component tungsten-containing diffusion barrier layer without an intervening layer.

16. The method of claim 1, wherein the method further comprises decomposition of the reducing agent to form a layer of B, Si, or Ge on the dielectric surface.

17. The method of claim 1, wherein the multi-component tungsten-containing diffusion barrier layer contains between 15% and 50% (atomic) B, Si, or Ge.

18. The method of claim 1, wherein the multi-component tungsten-containing diffusion barrier layer is selected from the group consisting of quaternary silicon-containing compounds and $WSi_xN_y$, and $WSi_xC_y$, wherein x, y, and z are numbers greater than zero.

19. A method comprising:
   depositing a multi-component tungsten-containing diffusion barrier layer on a dielectric surface of a substrate, wherein depositing the multi-component tungsten-containing diffusion barrier layer comprises exposing the substrate to alternating pulses of a reducing agent and tungsten chloride; wherein the reducing agent is selected from a boron-containing reducing agent, a silicon-containing reducing agent, and germanium-containing reducing agent, wherein the multi-component tungsten-containing diffusion barrier layer is a ternary or quaternary tungsten-containing film and wherein the multi-component tungsten-containing diffusion barrier layer comprises between 5% and 60% (atomic) Si; and
   depositing a bulk tungsten layer on the multi-component tungsten-containing diffusion barrier layer.

* * * * *